(12) United States Patent
Bancel et al.

(10) Patent No.: US 7,568,140 B2
(45) Date of Patent: Jul. 28, 2009

(54) INTEGRATED CIRCUIT HAVING CONFIGURABLE CELLS AND A SECURED TEST MODE

(75) Inventors: Frédéric Bancel, Lamanon (FR); David Hely, Les Pennes Mirabeau (FR)

(73) Assignee: STMicroelectronics SA, Montrouge (FR)

( * ) Notice: Subject to any disclaimer, the term of this patent is extended or adjusted under 35 U.S.C. 154(b) by 42 days.

(21) Appl. No.: 11/913,102

(22) PCT Filed: Apr. 21, 2006

(86) PCT No.: PCT/FR2006/000901

§ 371 (c)(1),
(2), (4) Date: Dec. 12, 2007

(87) PCT Pub. No.: WO2006/120315

PCT Pub. Date: Nov. 16, 2006

(65) Prior Publication Data

US 2008/0191741 A1    Aug. 14, 2008

(30) Foreign Application Priority Data

May 4, 2005    (FR) .................................. 05 04526

(51) Int. Cl.
*G01R 31/28* (2006.01)
*G06F 11/30* (2006.01)
(52) U.S. Cl. ...................... 714/726; 713/194
(58) Field of Classification Search ................ 714/724; 713/189, 194
See application file for complete search history.

(56) References Cited

U.S. PATENT DOCUMENTS

| | | | | |
|---|---|---|---|---|
| 5,293,610 A | * | 3/1994 | Schwarz | 711/164 |
| 5,452,355 A | * | 9/1995 | Coli | 713/194 |
| 6,316,959 B1 | | 11/2001 | Onodera | |
| 6,457,126 B1 | * | 9/2002 | Nakamura et al. | 713/166 |
| 7,076,667 B1 | * | 7/2006 | Gama et al. | 713/193 |
| 7,106,091 B2 | * | 9/2006 | Gammel | 326/8 |
| 2002/0133773 A1 | * | 9/2002 | Richter et al. | 714/733 |
| 2003/0204801 A1 | * | 10/2003 | Tkacik et al. | 714/726 |

OTHER PUBLICATIONS

Scan Based Side Channel Attack on Dedicated hardware implementations of Data Encryption Standard' by Yang et al. International Test Conference, Proceedings. ITC 2004. Publication Date: Oct. 26-28, 2004 pp. 339-344 ISBN: 0-7803-8580-2 INSPEC Accession No. 8291736.*

(Continued)

*Primary Examiner*—Cynthia Britt
(74) *Attorney, Agent, or Firm*—Hogan & Hartson LLP

(57) ABSTRACT

An electronic circuit includes a plurality of configurable cells configured by a control circuit such as a test access controller when it receives a mode command signal: either in a functional state in which the configurable cells are functionally linked to logic cells with which they co-operate to form at least one logic circuit if the mode command signal is in a first state or in a chained state in which the configurable cells are functionally connected in a chain to form a shift register, if the mode command signal is in a second state. The electronic circuit also includes a detection circuit laid out to produce an active state signal if it detects a chained state of the configurable cells while the controller receives the mode command signal in the first state.

11 Claims, 2 Drawing Sheets

OTHER PUBLICATIONS

"Automatic Test Equipment (ATE) on a Network (securing access tO equipment and data)" by McCarthy, Autotestcon Proceedings, 2000 IEEE Publication Date: 2000 On pp. 490-496 ISBN: 0-7803-5868-6 INSPEC Accession No. 6812928.*

Hely, et al. "Test Control for Secure Scan Designs"; Test Symposium 2005; European Tallinn, Estonia; IEEE; May 2005; pp. 190-195; US.

PCT Preliminary Report on Patentability for PCT/FR2006/000901, mailed Jul. 30, 2007.

Williams, et al. "Enhancing Tesability of Large-Scale Integrated Circuits via Test Points and Additional Logic"; IEEE Transactions on Computers; Jan. 1973; pp. 46-60; vol. c-22, No. 1.

* cited by examiner

INTEGRATED CIRCUIT HAVING CONFIGURABLE CELLS AND A SECURED TEST MODE

CROSS-REFERENCE TO RELATED APPLICATIONS

The present application is a national filing in the U.S. Patent & Trademark Office of PCT/FR2006/000901 filed Apr. 21, 2006, and claims priority of France Patent Application No. 0504526 filed May 4, 2005, both of which applications are incorporated herein in their entireties by this reference,

FIELD OF THE INVENTION

The invention generally relates to synchronous electronic integrated circuits provided with combinatorial logic means, flip-flop circuits and test means.

More specifically, the invention relates to an electronic circuit comprising a plurality of configurable cells, configured by a control circuit such as an access port controller.

BACKGROUND OF THE INVENTION

Description of the Prior Art

At present, there are well-known ways of testing for the proper working of the functional elements of an integrated circuit. This is done by the imposition and/or determination, at predefined instants, of the values of data present at certain internal points of this integrated circuit. A technique of this kind for testing the internal paths of an integrated circuit, known as a "scanpath" or "internal scan method" is described for example in M. Williams and J. Angel, "Enhancing Testability of LSI Circuits Via Test Points and Additional Logic", IEEE Transactions on Computers, Vol. C-22, No. 1; January 1973.

In this technique, each of the flip-flop circuits of the logic circuit, for which it is necessary to know the state and/or dictate the content during the standard operation of the integrated circuit, is provided at one input with a multiplexer. The different flip-flop circuits and the multiplexers that are associated with them thus constitute an equivalent number of configurable cells whose access points are controlled by these multiplexers.

The multiplexers of the different configurable cells are collectively controlled by a TAP (test access port) controller which, depending on a command signal defining a selected mode of operation, uses this set of configurable cells either as a standard functional circuit integrated with the logic circuit that it forms with the logic cells, or as a test circuit.

To do this, the TAP controller receives control signals on different command conductors and/or address conductors by which it is connected to the different configurable cells. These command signals are for example a mode command signal, a chaining command signal or again a data-propagation command signal that permits the modification of and/or modifies the data circulation paths within the integrated circuit and also enables the controller to capture data for subsequent analysis.

In standard operating mode, the TAP controller therefore drives the multiplexers of the configurable cells so that the flip-flop circuits of these cells are connected to surrounding logic cells to define one or more functional sub-units of the integrated circuit.

In the test mode, which is normally activated upon reception by the TAP controller of a command signal commanding passage into test mode, this controller produces a chaining command signal to set up a series connection of the flip-flop circuits of the configurable cells so as to form a shift register.

This register has especially a series input and a series output respectively connected to one output and to one input of the TAP controller, as well as a clock input receiving a clock signal to set the rate of the datastream.

Initially, the TAP controller serially loads data into the flip-flop circuits of the configurable cells through the input of the shift register formed by these configurable cells.

Then, the TAP controller changes the switching of the multiplexers to form the functional circuit, and commands the execution of one of more clock cycles by this functional circuit. In this phase, the data loaded into the flip-flop circuits of the configurable cells are processed by the functional circuit.

The controller then changes the switching of the multiplexers once again to form the shift register once again and serially retrieves, at output of this shift register, the data stored in the flip-flop circuits of the configurable cells during the last clock cycle.

Despite the confirmed value of this testing technique, its practical application can be a problem in certain circumstances, especially in integrated circuits that process secret data.

For, since the activation of the test mode may enable a fraudulent individual to read the contents of the flip-flop circuits of the configurable cells, this test has the drawback, in principle, of making such circuits very vulnerable to fraudulent use.

For example, by stopping a process of internal loading of secret data into the integrated circuit at various points in time, and by unloading the content of the shift register, a fraudulent individual could obtain information on secret data or even reconstitute this secret data.

By activating the test mode, a fraudulent individual could also obtain write access to the flip-flop circuits of the configurable cells to insert fraudulent data or else to place the integrated circuit in an unauthorized configuration. He could thus, for example, access a register controlling a security element such as a sensor to deactivate it. He could also inject a piece of erroneous data in order to obtain information on a piece of secret data.

The fraudulent individual may actually adopt two different strategies: the first strategy consists in taking control of the TAP controller and observing the content of the cells of the shift register at the external pads; the second strategy consists in taking control of the configurable cells by exciting them by micro-probing so as to simulate the driving of these cells by the command signals emitted by the TAP controller.

SUMMARY

It is precisely the aim of the present invention to propose an electronic circuit designed to thwart an attempt at fraud using the second strategy mentioned here above.

To achieve this goal, the circuit of the invention, which furthermore meets the generic definition given to it in the above introduction, essentially comprises a detection circuit laid out to produce an active state signal if it detects a chained state of the configurable cells while the controller receives the mode command signal in the first state.

When the mode command signal is in the first state, for example the inactive state, the configurable cells should be in standard mode. If the detection circuit detects the fact that the configurable cells are in a chained state, then this implies an attempt at intrusion, which the detection circuit reports by means of an active state signal.

The detection circuit according to the invention preferably comprises a state cell which is:

functionally connected in a chain between a preceding configurable cell and a following configurable cell if the configurable cells are in a chained state, said state cell producing an output signal representing the content of the chain or functionally cut off if the configurable cells are in the functional state, said state signal then producing an output signal that represents a reference value, and the detection circuit also comprises a comparison circuit to compare the output signal with a reference value when it receives the state signal and produce the active state signal if the value of the output signal is different from the reference value.

According to a first embodiment, the detection circuit comprises a single state cell, and an appropriate comparison circuit to process the signal produced by this single state cell.

According to another embodiment, the detection circuit comprises several state cells which are:

functionally connected in a chain with the configurable cells if the configurable cells are in the chained state, each state cell being connected between a preceding configurable cell and a following configurable cell, each state cell producing an output signal representing the content of the chain or functionally cut off if the configurable cells are in the functional state, each state cell then producing an output signal representing one reference value among a set of reference values, and the detection circuit also comprises a comparison circuit to compare the output signal with a reference value when it receives the command signal in the first state, and produce the active state signal if the value of one of the output signals is different from the associated reference value.

At least one state cell comprises a first data input to which there is applied a signal whose first potential is at the neutral value, a second data input connected to the output of the preceding configurable cell, a third selection input connected to the controller and an output connected firstly to the following configurable cell and, secondly, to a first data input of the comparison circuit. The reference value being applied to a second data input of the comparison circuit.

The configurable cell also preferably comprises:

a flip-flop circuit having one output connected to the output of said configurable cell, and a multiplexer having a first data input and a second data input respectively connected to the first input and to the second input of the configurable cell, a selection input connected to the third input of said configurable cell, and an output connected to the data input of the flip-flop circuit.

The comparison circuit as its part may comprise:

a combinatorial logic circuit to combine the output signals from several state cells with one another, and a means to compare the result of the combination with the reference value when it receives the mode command signal (TEST_MODE), and produce the active state signal (STATE) if the result of the combination is different from the reference value.

Finally, at least one configurable cell may be preferably made similarly to a state cell, the first data input of said configurable cell being connected to one output of a logic cell with which it co-operates.

BRIEF DESCRIPTION OF THE DRAWINGS

The invention will be understood more clearly and other features and advantages still appear from the following description of an exemplary implementation of a circuit comprising a secured test mode according to the invention. The description, given by way of an indication that in no way restricts the scope of the invention, must be read with reference to the appended drawings, of which.

DETAILED DESCRIPTION OF PREFERRED EMBODIMENTS

Figure 1:
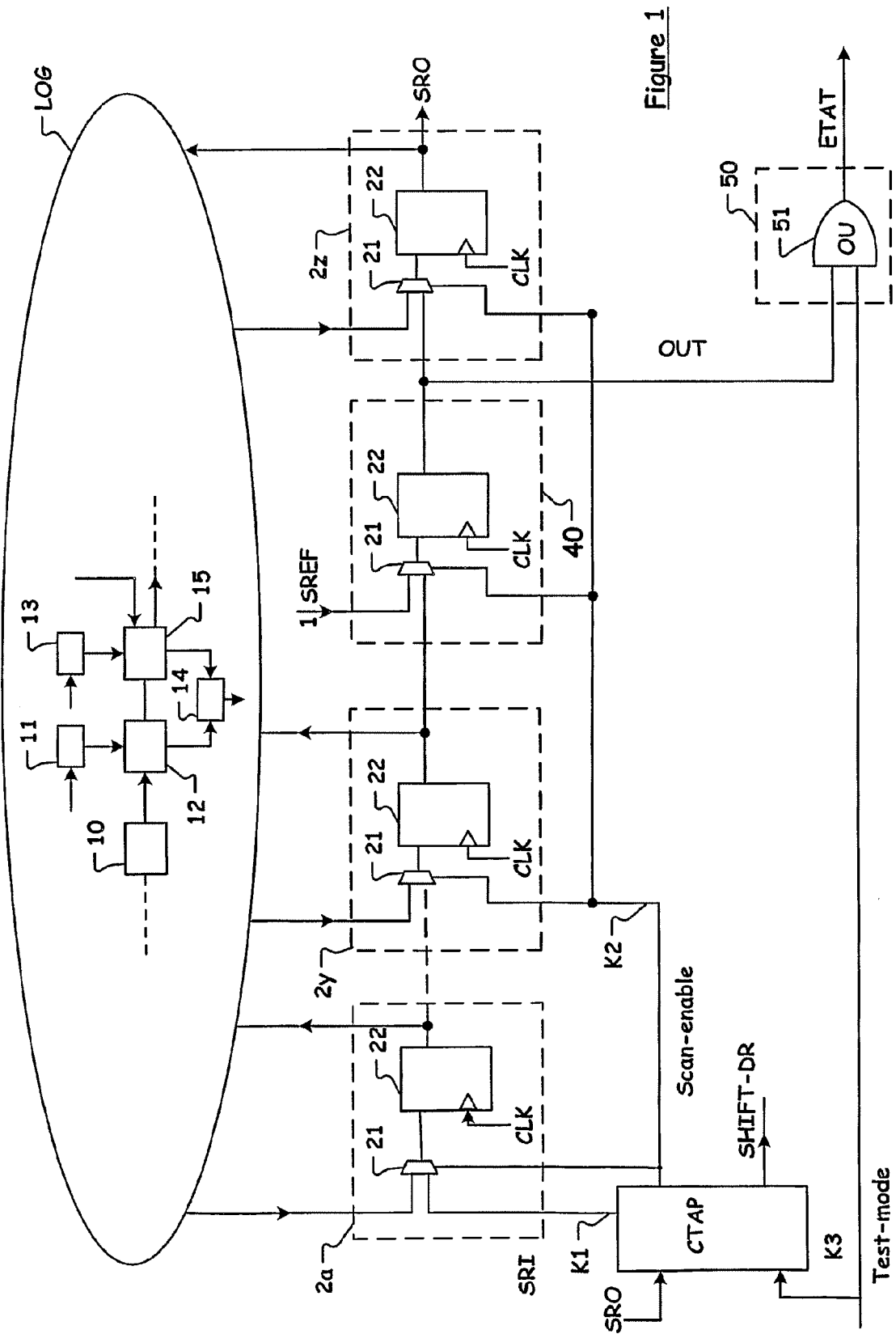
FIG. 1 is an electronic diagram of a first embodiment of the invention.

As announced here above, the invention relates to an electronic circuit provided with internal test means.

Such a circuit typically comprises a plurality of logic cells such as the cells 10 to 15, a plurality of configurable cells such as the cells 2a to 2y, 2z, a plurality of command conductors such as the conductors K1 to K3 as well as, if necessary, a controller such as an access port controller CTAP, which however may also be external to the electronic circuit concerned.

Each of the configurable cells 2a to 2z comprises:

a first data input connected to at least one of the logic cells 10 to 15 of the circuit LOG, a second data input connected to an output of a preceding configurable cell, a clock input to which the signal CLK is applied and a command input to which a SCAN_ENABLE signal is applied, one output connected to the second input of a following configurable cell and to at least one of the logic cells 10 to 15 of the circuit LOG.

Each configurable cell comprises at least one multiplexer 21 and at least one flip-flop circuit 22: two inputs of the multiplexer are connected to the inputs of the configurable cell, one output of the multiplexer is connected to the input of the flip-flop circuit 22, one output of which forms the output of the configurable cell.

The command conductors K1 to K3, at least some of which are connected to the configurable cells 2a to 2y, 2z, serve to transmit command signals that are selectively received and/or sent out in operation by the controller CTAP, such as a command signal TEST_MODE commanding passage into test mode which activates the controller CTAP, the chaining command signal SCAN_ENABLE which chains the configurable cells in the form of a shift register, and a command signal SHIFT_DR which enables the propagation of data in the configurable cells.

Depending on the command signals or on at least some of them, the configurable cells 2a to 2y, 2z adopt:

either a standard mode of operation in which they are functionally linked to at least some of the logic cells 10 to 15 with which they co-operate to form a logic circuit LOG, or a test mode in which these configurable cells 2a to 2z are functionally connected to one another in a chain to form a shift register.

The passage of the configurable cells from the standard operating mode to the test mode is done by the driving of the multiplexers 21 using the command signal SCAN_ENABLE delivered by the controller CTAP.

The shift register 2a to 2z especially has a data input SRI driven by one output of the controller CTAP, a data output SRO, connected to one input of the controller CTAP, and one clock input (not specifically represented) to receive a clock signal CLK capable of the setting the rate of the data flow in this shift register.

To launch a test, a signal TEST_MODE for commanding passage into test mode must first of all be sent to the controller CTAP. The controller CTAP then configures the configurable cells 2a to 2z as a shift register by sending the chaining command signal SCAN_ENABLE.

Then, by emitting the propagation command signal CLK, the controller CTAP serially loads test data into the flip-flop circuit 22 of these configurable cells through the input SRI of the shift register.

Then, by deactivating the chaining command signal SCAN_ENABLE, the controller CTAP reconfigures the configurable cells 2a to 2z into a functional element of the logic circuit LOG and commands the execution of one or more clock cycles by this functional element, which processes the test data.

By reactivating the chaining command signal SCAN_ENABLE, the controller CTAP again reconfigures the configurable cells 2a to 2z into a shift register.

Finally, by sending the propagation command signal CLK, the controller CTAP retrieves, at the output SRO of this register, the data that is stored in the flip-flop circuit 22 and comes from the processing of the test data by the logic circuit LOG.

To prevent especially a situation where a fraudulent individual is able to simulate a test procedure of this kind by the direct application of the command signals to the conductors K1 to K3, and/or data to the input SRI, and thus make it impossible for this fraudulent person to retrieve the data, stored in the flip-flop circuit 22, that comes from the processing of the test data by the logic circuit LOG, the electronic circuit of the invention comprises a state detection circuit 30

This state detection circuit 30 has the function, when the integrated circuit is in normal operation (with the TEST_MODE signal being inactive), of delivering a signal OUT representing the non-chained state of the configurable cells (signifying an absence of anomalies) or the chained state of the configurable cells (signifying an intrusion attempt).

Indeed, in normal operation, the signal TEST_MODE is inactive, the circuit CTAP delivers an inactive chaining command signal SCAN_ENABLE, and the configurable cells are normally in a non-chained state. Hence, if the state detection circuit detects the fact that the configurable cells are configured as a shift register (chained state), this necessarily means that there has been an intrusion attempt.

In a first embodiment of the invention, the state detection circuit 30 has a state cell 40 and a detection circuit 50.

The cell 40 is preferably made according to an electronic diagram similar to the electronic diagram of the configurable cells. The two main differences are the following:
  a reference signal SREF is applied to the first input of the state cells, which is therefore not connected to one of the logic cells of the circuit LOG, and
  the output of the state cell is connected to an input of the comparison circuit 50, and not to one of the logic cells of the circuit LOG.

Just like a configurable cell, the state cell comprises a multiplexer 21 and a flip-flop 22, connected in a similar way.

The signal SCAN_ENABLE is applied to a selection input of the multiplexer 21 and the clock signal CLK is applied to a clock input of the flip-flop circuit 22.

Thus made, the state cell 40 is:
  functionally connected in a chain between the preceding configurable cell 2y and the following configurable cell 2z if the configurable cells are in the chained state; said state cell 40 in this case produces an output signal OUT, representing the content of the chain, or
  functionally cut off if the configurable cells are in the functional state; the state cell 40 then produces an output signal OUT representing the value of the reference signal SREF (the value "1" in the example of FIG. 1) applied to its first data input.

The comparison circuit 50 has the function of verifying that the output signal OUT of the state cell is equal to the reference value which is applied to its first input and of reporting, when the signal is in a normal mode of operation (signal TEST_MODE inactive, here at 0):
  either an absence of anomaly if the output signal OUT has the expected value (in the example the value 1); in this case, STATE=1, inactive,
  or an intrusion attempt if the signal OUT has a value different from the expected value; in this case, STATE=0, active.

In the first embodiment, as shown in FIG. 1, the comparison circuit 50 has an OR type logic gate comprising a first input connected to the output of the cell 40 and a second input to which the signal TEST_MODE is applied.

The following is the working of the detection circuit of FIG. 1. In the integrated circuit test mode, the signal TEST_MODE is active (herein active at "1"); in this case, the OR gate 51 produces an inactive signal STATE=1.

However, in the standard operating mode of the integrated circuit, the signal TEST_MODE is inactive (here it is inactive at "0") and, if the signal OUT at output of the cell 40 is equal to "0" (i.e. if it is different from the signal SREF applied to the first input of the cell 40), it means that the signal output from the state cell necessarily comes from the output of the configurable cell 2y preceding the state cell 40. In other words, it means that the configurable cells and the state cell are chained. In this case, the OR gate 50 delivers an active signal STATE=0, to indicate an intrusion attempt.

It will be noted that the detection circuit such as the one described here above is efficient only if the piece of data contained in the configurable cells preceding the state cell contains something other than the reference value (in this case, a "1") applied to the first input of the state cell.

However, during an intrusion attempt, a fraudulent individual will try to enter data into the shift register or, on the contrary, to output data from the register. In both cases, this would entail shifting the data within the register. Since it is very unlikely that the pieces of data from the register are all equal to the reference value, the detection circuit will rapidly become efficient, after a few active edges of the clock signal.

Figure 2:
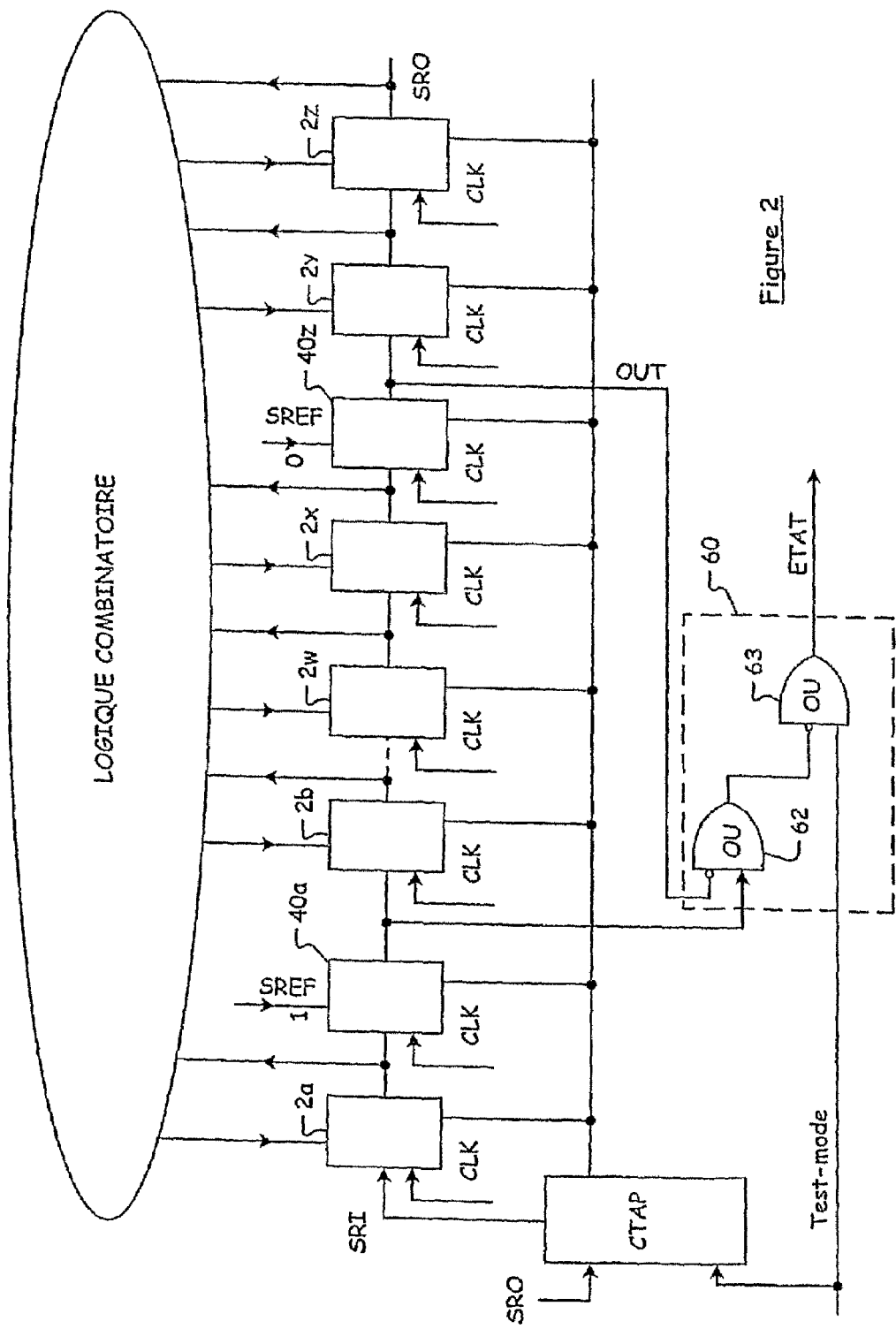
FIG. 2 is an electronic diagram of a second embodiment of the invention.

FIG. 2 shows a second and more efficient embodiment of the detection circuit according to the invention, comprising several state cells 40a, . . . 40z (only two are shown for the sake of simplification), and one comparison circuit 60.

The state cells 40a, . . . , 40z are made for example identically to the cell 40 of FIG. 1, with a multiplexer 21 and a flip-flop circuit 22, and are connected similarly. The choice of the number of state cells is based on a compromise between the security of the circuit on the one hand and the size and speed of the circuit on the other: the greater the number of state cells, the greater the speed with which an intrusion attempt can be detected. At the same time, the bulkier and slower will the circuit be in test mode. In a preferred example, the number of state cells selected will be a number in the range of about 5% of the number of configurable cells.

A reference signal SREFa to SREFz is applied to the first input of each of the state cells 40a to 40z. This reference signal SREFa to SREFz is equal, by choice, to a logic "1" or "0" it being possible for the value applied to be different from one state cell to another. Each state cell produces an output signal OUTa to OUTz which is equal to the value applied to its first input or to the value present at output of the preceding configurable cell, depending on the value of the command signal SCAN_ENABLE applied to its control input.

The state cells are distributed among the configurable cells of the shift register, preferably randomly, so as to prevent the position of the state cells from being identified and exploited by any fraudulent individual.

The comparison circuit 60 has the function of verifying that the output signal OUTa to OUTz of each state cell is equal to the reference value applied to its first input and of reporting, when the signal is in a normal mode of operation (signal TEST_MODE=0, inactive):
  either an absence of anomaly if the output signals OUTa, ..., OUTz all have the expected value; in this case, STATE=1, inactive,
  or an intrusion attempt if at least one of the output signals OUTa, ..., OUTz has a value different from the value expected for this signal; in this case, STATE=0, active.

In the case of a detection circuit according to FIG. 2, comprising two state cells 40a and 40z, the comparison circuit may have two logic gates 62, 63.

The gate 63 is an OR type gate. It has a non-inverter input to which the signal OUTa is applied and an inverter input to which the signal OUTz is applied. The gate 63 is an OR type gate. It has an inverter input connected to an output of the gate 62, a non-inverter input to which the signal TEST_MODE is applied and an output at which the signal STATE is produced.

Naturally, the embodiment of the comparison circuit 60 depends especially on the number of state cells chosen, the values of the reference signals applied to their first input, the value of the signal TEST_MODE when it is active, the size and speed of the total circuit obtained, etc. It is necessary simply to choose an embodiment such that:
  the circuit 60 is active only in normal operating mode (TEST_MODE inactive)
  the circuit 60 verifies the value of each signal OUTa to OUTz individually relative to the associated reference value or verifies a combination of the signals relative to an associated value of a combination of the reference values applied respectively to the first input of each state cell.

The circuit 60 may be made especially out of a set of logic gates of an appropriate type, or else out of comparators of all types.

What is claimed is:

1. An electronic circuit comprising:
  a plurality of configurable cells configured by a control circuit such as a test access controller when it receives a mode command signal:
    either in a functional state in which the configurable cells are functionally linked to logic cells with which they co-operate to form at least one logic circuit if the mode command signal is in a first state,
    or in a chained state in which the configurable cells are functionally connected in a chain to form a shift register, if the mode command signal is in a second state,
  a detection circuit laid out to produce an active state signal if it detects a chained state of the configurable cells while the controller receives the mode command signal in the first state, the detection circuit comprising:
    a state cell comprising a first data input to which there is applied a signal having a reference value, a second data input connected to the output of a preceding configurable cell, a third selection input connected to the controller and an output connected to a following configurable cell, the state cell being:
      functionally connected in a chain between the preceding configurable cell and the following configurable cell if the configurable cells are in the chained state, said state cell producing an output signal representing the content of the chain, or
      functionally cut off if the configurable cells are in the functional state, said state signal then producing an output signal that represents the reference value,
    a comparison circuit comprising a first data input connected to the output of the state cell and a second data input on which the mode command signal is applied, to compare the output signal with the reference value when it receives the mode command signal and produce the active state signal if the value of the output signal is different from the reference value.

2. A circuit according to claim 1, wherein the detection circuit comprises several state cells which are:
  functionally connected in a chain with the configurable cells if the configurable cells are in the chained state, each state cell being connected between the preceding configurable cell and the following configurable cell, each state cell producing an output signal representing the content of the chain or
  functionally cut off if the configurable cells are in the functional state, each state cell then producing an output signal representing one reference value among a set of reference values,
the comparison circuit comparing the output signal of each state cell with a reference value when it receives the mode command signal in the first state, and producing the active state signal if the value of one of the output signals is different from the associated reference value.

3. A circuit according to claim 2 wherein each configurable cell of said plurality of configurable cells also comprises:
  a flip-flop circuit having one output connected to the output of each configurable cell, and
  a multiplexer having a first data input and a second data input respectively connected to the first input and to the second input of each configurable cell, a selection input connected to the third input of each configurable cell, and an output connected to the data input of the flip-flop circuit.

4. A circuit according claim 2, wherein the comparison circuit comprises:
  a combinatorial logic circuit to combine the output signals from several state cells with one another, and
  a means to compare the result of the combination with the reference value when it receives the mode command signal, and produce the active state signal if the result of the combination is different from the reference value.

5. A circuit according to claim 2, wherein at least one configurable cell of said plurality of configurable cells is made similarly to a state cell, the first data input of said at least one configurable cell being connected to one output of a logic cell with which it co-operates.

6. A circuit according to claim 1 wherein each configurable cell in said plurality of configurable cells also comprises:
  a flip-flop circuit having one output connected to the output of each configurable cell, and
  a multiplexer having a first data input and a second data input respectively connected to the first input and to the second input of each configurable cell, a selection input connected to the third input of each configurable cell, and an output connected to the data input of the flip-flop circuit.

7. A circuit according claim 6, wherein the comparison circuit comprises:
   a combinatorial logic circuit to combine the output signals from several state cells with one another, and
   a means to compare the result of the combination with the reference value when it receives the mode command signal, and produce the active state signal if the result of the combination is different from the reference value.

8. A circuit according to claim 6, wherein at least one configurable cell of said plurality of configurable cells is made similarly to a state cell, the first data input of said at least one configurable cell being connected to one output of a logic cell with which it co-operates.

9. A circuit according claim 1, wherein the comparison circuit comprises:
   a combinatorial logic circuit to combine the output signals from several state cells with one another, and
   a means to compare the result of the combination with the reference value when it receives the mode command signal and produce the active state signal if the result of the combination is different from the reference value.

10. A circuit according to claim 9, wherein at least one configurable cell of said plurality of configurable cells is made similarly to a state cell, the first data input of said at least one configurable cell being connected to one output of a logic cell with which it co-operates.

11. A circuit according to claim 1, wherein at least one configurable cell of said plurality of configurable cells is made similarly to a state cell, the first data input of said at least one configurable cell being connected to one output of a logic cell with which it co-operates.

* * * * *